(12) United States Patent
Man et al.

(10) Patent No.: US 11,114,276 B2
(45) Date of Patent: Sep. 7, 2021

(54) APPARATUS, METHOD, AND PROGRAM FOR PROCESSING AND OBSERVING CROSS SECTION, AND METHOD OF MEASURING SHAPE

(71) Applicant: HITACHI HIGH-TECH SCIENCE CORPORATION, Tokyo (JP)

(72) Inventors: Xin Man, Tokyo (JP); Tatsuya Asahata, Tokyo (JP); Makoto Sato, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/294,543

(22) Filed: Mar. 6, 2019

(65) Prior Publication Data

US 2019/0279843 A1 Sep. 12, 2019

(30) Foreign Application Priority Data

Mar. 7, 2018 (JP) .............................. JP2018-041313

(51) Int. Cl.
*H01J 37/304* (2006.01)
*H01J 37/244* (2006.01)
(Continued)

(52) U.S. Cl.
CPC .......... *H01J 37/304* (2013.01); *H01J 37/222* (2013.01); *H01J 37/244* (2013.01); *H01J 37/28* (2013.01);
(Continued)

(58) Field of Classification Search
CPC ........ H01J 37/3056; H01J 37/31; H01J 37/28; H01J 37/222; H01J 37/304;
(Continued)

(56) References Cited

U.S. PATENT DOCUMENTS 7,358,493 B2 * 4/2008 Roberts ................. H01J 37/222
250/310
8,212,227 B2 * 7/2012 Watanabe ........... H01J 37/3174
250/492.3

(Continued)

FOREIGN PATENT DOCUMENTS

JP 2015050126 B1 3/2015

*Primary Examiner* — Wyatt A Stoffa
(74) *Attorney, Agent, or Firm* — Holland & Hart LLP

(57) ABSTRACT

An apparatus for processing and observing a cross-section includes: a sample bed holding a sample; a focused ion beam column radiating a focused ion beam to the sample; an electron beam column radiating an electron beam to the sample, perpendicularly to the focused ion beam; an electron detector detecting secondary electrons or reflection electrons generated from the sample; a irradiation position controller controlling irradiation positions of the focused ion beam and the electron beam based on target irradiation position information showing target irradiation positions of beams on the sample; a process controller controlling a cross-section-exposing process that exposes a cross-section of the sample by radiating the focused ion beam to the sample and a cross-section image-obtaining process that obtains a cross-section image of the cross-section by radiating the electron beam to the cross-section; and an image quality corrector correcting image quality of the cross-section image obtained.

11 Claims, 6 Drawing Sheets

(51) Int. Cl.
- *H01J 37/28* (2006.01)
- *H01J 37/305* (2006.01)
- *H01J 37/22* (2006.01)

(52) U.S. Cl.
CPC ............. *H01J 37/3056* (2013.01); *G06T 2207/10061* (2013.01); *H01J 2237/2448* (2013.01); *H01J 2237/24475* (2013.01); *H01J 2237/31745* (2013.01)

(58) Field of Classification Search
CPC ... H01J 2237/31749; H01J 2237/31745; H01J 37/244; H01J 37/24475; H01J 2237/2448; H01J 2237/221; G06T 2207/10061; G01N 1/32; G01B 15/04
See application file for complete search history.

(56) References Cited

U.S. PATENT DOCUMENTS

| | | | | |
|---|---|---|---|---|
| 8,237,119 | B2* | 8/2012 | Nakahira | H01J 37/222 |
| | | | | 250/307 |
| 8,350,237 | B2* | 1/2013 | Tanner | G01N 1/286 |
| | | | | 250/492.3 |
| 9,218,940 | B1* | 12/2015 | Brogden | G01N 23/2255 |
| 9,341,584 | B2* | 5/2016 | Nakahira | G01N 23/2255 |
| 9,824,853 | B2* | 11/2017 | Kobayashi | H01J 37/244 |
| 10,074,510 | B2* | 9/2018 | Suematsu | H01J 37/20 |
| 2005/0092930 | A1* | 5/2005 | Watanabe | G01R 31/307 |
| | | | | 250/398 |
| 2005/0194536 | A1* | 9/2005 | Furiki | G01N 23/225 |
| | | | | 250/311 |
| 2009/0283677 | A1* | 11/2009 | Ikku | G01N 23/2208 |
| | | | | 250/307 |
| 2011/0226947 | A1* | 9/2011 | Takahashi | H01J 37/20 |
| | | | | 250/307 |
| 2011/0249110 | A1* | 10/2011 | Okai | H01J 37/222 |
| | | | | 348/80 |
| 2013/0075606 | A1* | 3/2013 | Uemoto | H01J 37/261 |
| | | | | 250/310 |
| 2013/0082176 | A1* | 4/2013 | Yamamoto | G01N 23/04 |
| | | | | 250/310 |
| 2013/0222574 | A1* | 8/2013 | Nakagaki | G06T 7/0004 |
| | | | | 348/125 |
| 2013/0248707 | A1* | 9/2013 | Man | H01J 37/28 |
| | | | | 250/307 |
| 2013/0278745 | A1* | 10/2013 | Kamio | H01J 37/244 |
| | | | | 348/80 |
| 2013/0300854 | A1* | 11/2013 | Dong | H04N 5/217 |
| | | | | 348/80 |
| 2013/0320209 | A1* | 12/2013 | Shichi | H01J 37/261 |
| | | | | 250/307 |
| 2015/0060664 | A1* | 3/2015 | Man | G01N 23/20091 |
| | | | | 250/307 |
| 2015/0060668 | A1* | 3/2015 | Man | H01J 37/317 |
| | | | | 250/310 |
| 2015/0060695 | A1* | 3/2015 | Man | H01J 37/317 |
| | | | | 250/442.11 |
| 2015/0206706 | A1* | 7/2015 | Man | H01J 37/20 |
| | | | | 250/307 |
| 2015/0212019 | A1* | 7/2015 | Shishido | G01B 15/04 |
| | | | | 250/307 |
| 2015/0214000 | A1* | 7/2015 | Hirai | H01J 37/222 |
| | | | | 382/141 |
| 2015/0228443 | A1* | 8/2015 | Morita | H01J 37/141 |
| | | | | 250/310 |
| 2015/0348751 | A1* | 12/2015 | Brogden | G01N 23/2208 |
| | | | | 250/307 |
| 2016/0126060 | A1* | 5/2016 | Fuller | H01J 37/3005 |
| | | | | 250/492.3 |
| 2016/0189929 | A1* | 6/2016 | Hammer | G01N 1/32 |
| | | | | 250/492.21 |
| 2016/0343541 | A1* | 11/2016 | Man | H01J 37/3056 |
| 2017/0278668 | A1* | 9/2017 | Man | H01J 37/222 |
| 2018/0053627 | A1* | 2/2018 | Phaneuf | H01J 37/28 |
| 2018/0247394 | A1* | 8/2018 | Lee | G06T 5/20 |
| 2019/0066971 | A1* | 2/2019 | Nakazawa | G06T 5/50 |

* cited by examiner

APPARATUS, METHOD, AND PROGRAM FOR PROCESSING AND OBSERVING CROSS SECTION, AND METHOD OF MEASURING SHAPE

CROSS REFERENCE TO RELATED APPLICATION

The present application claims priority to Japanese Patent Application No. JP 2018-041313, filed Mar. 7, 2018, the entire contents of which are incorporated herein for all purposes by this reference.

TECHNICAL FIELD

The present invention relates to an apparatus, method, and program for processing and observing a cross section, and a method of measuring shape.

BACKGROUND ART

In the related art, for example, as one of the methods of analyzing or three-dimensionally observing the inside of samples such as a semiconductor device, there has been known a method of processing and observing cross sections, the method constructing a 3D image of a sample by repeating a process (etching) that forms a cross section using Focused Ion Beams (FIB), radiating Electron Beams (EB) at an angle to the cross sections using a Scanning Electron Microscope (SEM), obtaining a plurality of layers of cross section images of the sample, and then layering the cross section images.

This method of processing and observing cross sections, which is called ⌈Cut & See⌋ that uses a composite charged particle beam device, has an advantage, which other methods do not have, in that it is possible to three-dimensionally observe the inside of samples at several angles, in addition to being able to see cross section images of samples.

In detail, for example, the method exposes a cross section of a sample by performing etching by irradiating the sample with FIBs. Then, the method obtains a cross section image by irradiating the exposed cross section with electron beams using an SEM. Then, the method exposes the next cross section by performing etching again. Further, the method obtains a second cross section image through observation using the SEM. As described above, the method obtains several cross section images by repeating etching and observation using an SEM at a predetermined angle to a sample. Further, the method measures the shape of each part of a sample by constructing a 3D image showing the inside of the sample by layering several layers of obtained cross section images.

DOCUMENTS OF RELATED ART (Patent Document 1) Japanese Patent Application Publication No. 2015-050126

DISCLOSURE

Technical Problem

However, according to the ⌈Cut & See⌋ method that uses a composite charged particle beam device, since cross sections are observed at an angle, when the shape of a sample is measured, it is required to correct the angle in the obtained cross section images. Accordingly, precision of a 3D image constructed from several cross section images is deteriorated and it is impossible to improve measurement precision when measuring a shape based on a 3D image.

The present invention has been made in an effort to solve the problems and an object of the present invention is to provide an apparatus, method, and program for processing and observing a cross section and a method of measuring a shape that can improve the precision of measuring the shape of a sample.

Technical Solution (1) An aspect of the present invention provides an apparatus for processing and observing a cross section. The apparatus includes: a sample bed holding a sample; a focused ion beam column irradiating the sample with a focused ion beam; an electron beam column irradiating the sample with an electron beam in a direction perpendicular to a direction of irradiation of the focused ion beam; an electron detector detecting secondary electrons or reflection electrons generated from the sample; a irradiation position controller controlling irradiation positions of the focused ion beam and the electron beam based on target irradiation position information stored in a memory unit as information showing target irradiation positions of beams on the sample; a process controller controlling a cross section-exposing process that exposes a cross section of the sample by irradiating the sample with the focused ion beam and a cross section image-obtaining process that obtains a cross section image of the cross section by irradiating the cross section with the electron beam, for the irradiation positions that are controlled by the irradiation position controller; and an image quality corrector correcting image quality of the cross section image obtained for the irradiation positions.

(2) In the apparatus for processing and observing a cross section according to an aspect of the present invention, the image quality corrector may correct the image quality of the cross section image based on reference image quality information stored in advance in relation to the target irradiation positions as information showing reference image quality of the cross section image.

(3) In the apparatus for processing and observing a cross section according to an aspect of the present invention, when image quality of the cross section image exceeds a permission range of image quality shown by the reference image quality information, the image quality corrector may correct the image quality of the cross section image.

(4) In the apparatus for processing and observing a cross section according to an aspect of the present invention, the image quality corrector may correct the image quality of the cross section image based on intensity information showing a change to time of intensity of the electron beam radiated from the electron beam column.

(5) The apparatus for processing and observing a cross section according to an aspect of the present invention further includes a cross section image group output unit outputting a cross section image group including the cross section image with the image quality corrected by the image quality corrector to a measuring device that measures a structure of the sample.

(6) Another aspect of the present invention provides a method of processing and observing a cross section that uses an apparatus for processing and observing a cross section, the apparatus including a sample bed holding a sample, a focused ion beam column irradiating the sample with a focused ion beam, an electron beam column irradiating the sample with an electron beam in a direction perpendicular to a direction of irradiation of the focused ion beam, and an electron detector detecting secondary electrons or reflection electrons generated from the sample. The method includes: a irradiation position control process that controls irradiation positions of the focused ion beam and the electron beam based on target irradiation position information stored in a memory unit as information showing target irradiation positions of beams on the sample; a cross section-exposing process that exposes a cross section of the sample by irradiating the sample with the focused ion beam for the irradiation positions that are controlled in the irradiation position control process; a cross section image-obtaining process that obtains a cross section image of the cross section by irradiating the cross section with the electron beam for the irradiation positions that are controlled in the irradiation position control process; and an image quality-correcting process that corrects image quality of the cross section image obtained in the cross section image-obtaining process.

(7) Another aspect of the present invention provides a program for processing and observing a cross section. The program performs, in a computer of an apparatus for processing and observing a cross section, the apparatus including a sample bed holding a sample, a focused ion beam column irradiating the sample with a focused ion beam, an electron beam column irradiating the sample with an electron beam in a direction perpendicular to a direction of irradiation of the focused ion beam, and an electron detector detecting secondary electrons or reflection electrons generated from the sample, a irradiation position control process that controls irradiation positions of the focused ion beam and the electron beam based on target irradiation position information stored in a memory unit as information showing target irradiation positions of beams on the sample; a cross section-exposing process that exposes a cross section of the sample by irradiating the sample with the focused ion beam for the irradiation positions that are controlled in the irradiation position control process; a cross section image-obtaining process that obtains a cross section image of the cross section by irradiating the cross section with the electron beam for the irradiation positions that are controlled in the irradiation position control process; an image quality-correcting process that corrects image quality of the cross section image obtained in the cross section image-obtaining process.

(8) Another aspect of the present invention provides a method of measuring a shape of a structure in a sample using an apparatus for processing and observing a cross section, the apparatus including a focused ion beam column irradiating the sample with a focused ion beam and an electron beam column irradiating the sample with an electron beam in a direction perpendicular to a direction of irradiation of the focused ion beam. The method includes: a process that puts the sample at a position to which the focused ion beam and the electron beam are radiated, by moving a sample bed in a direction perpendicular to the focused ion beam and the electron beam; a cross section processing-observing process that repeats a cross section-exposing process that forms a cross section on which the structure is exposed by irradiating the sample with the focused ion beam and a cross section image-obtaining process that obtains an observation image of the cross section by radiating the electron beam in a direction perpendicular to the cross section; and a measuring process that measures a shape of the structure from the cross section image.

According to the apparatus, method, and program for processing and observing a cross section, and the method of measuring shape of the present invention, it is possible to improve precision of measuring a shape of a sample.

MODE FOR INVENTION

Embodiment

Hereinafter, embodiments of the present invention are described with reference to drawings.

Figure 1:
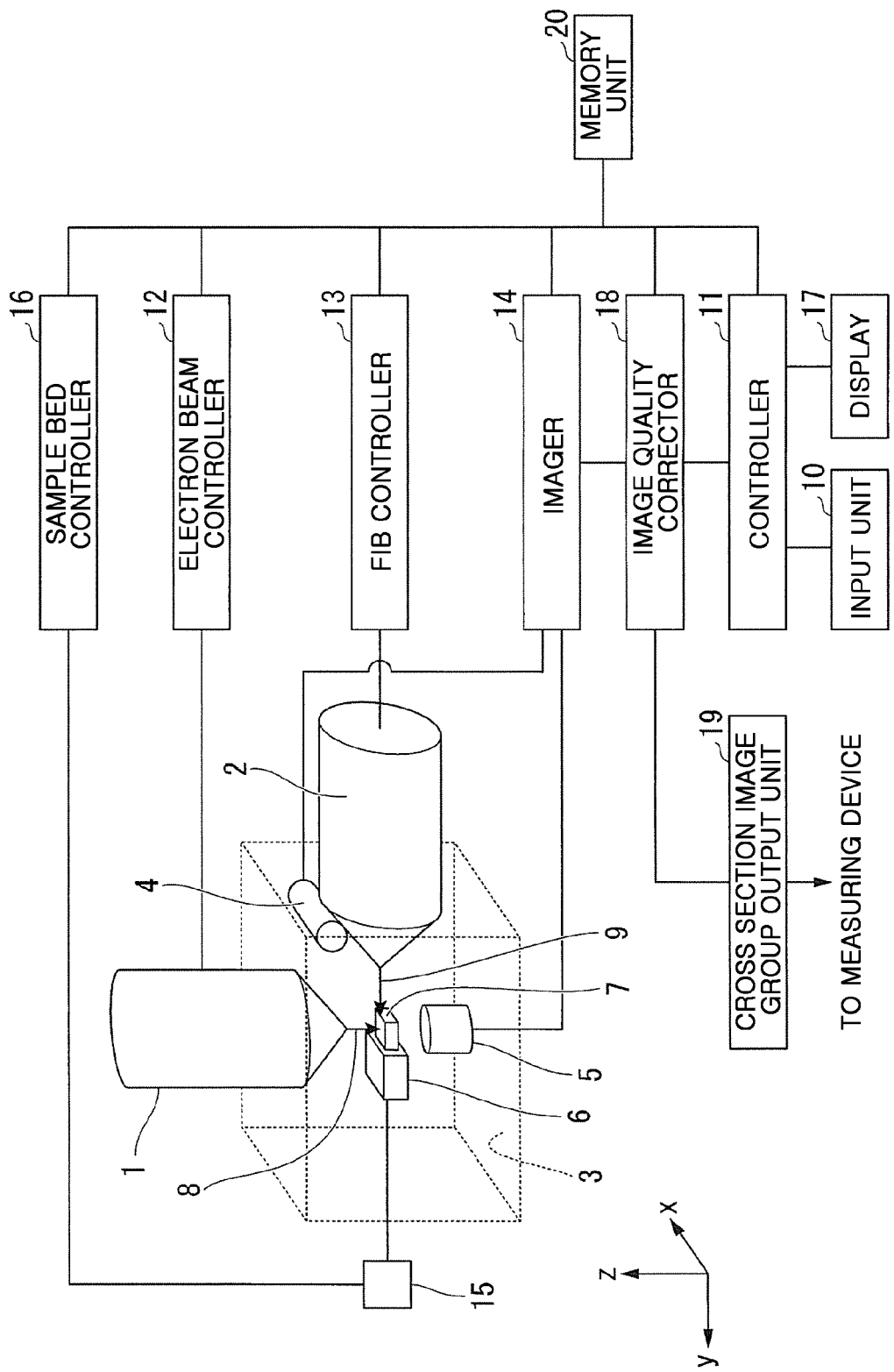
FIG. 1 is a view showing an example of the configuration of an apparatus for processing and observing a cross section according to an embodiment of the present invention.

FIG. 1 is a view showing an example of the configuration of an apparatus 100 for processing and observing a cross section according to an embodiment of the present invention. The apparatus 100 for processing and observing a cross section includes an electron beam column 1, a focused ion beam column 2, and a sample chamber 3.

The electron beam column 1 irradiates a sample 7 with an electron beam 8 in the sample chamber 3.

The focused ion beam column 2 irradiates the sample 7 with a focusing beam 9 in the sample chamber 3. The electron beam column 1 and the focused ion beam column 2 are arranged such that their irradiation axes are perpendicular to each other on the sample 7. That is, the electron beam column 1 irradiates the sample 7 with the electron beam 8 in a direction of perpendicular to the focused ion beam 9.

The apparatus 100 for processing and observing a cross section further includes a secondary electron detector 4 and a transmission electron detector 5 that are electron detectors. The electron detectors such as the secondary electron detector 4 or the transmission electron detector 5 detect secondary electrons or reflection electrons that are generated from the sample 7.

In detail, the secondary electron detector 4 detects secondary electrons that are generated from the sample 7 due to irradiation of the electron beam 8 or the focused ion beam 9. The transmission electron detector 5 is disposed opposite the electron beam column 1. The transmission electron detector 5 detects transmission electrons that have passed through the sample 7 and the electron beam 8 that has not travel into the sample 7 when the electron beam 8 is radiated to the sample 7.

The apparatus 100 for processing and observing a cross section further includes a sample bed 6 for holding the sample 7. The sample bed 6 is driven by a sample bed actuator 15 that is controlled by a sample bed controller 16.

The sample bed actuator 15 moves the sample bed 6 in three axial directions of x-axial, y-axial, and z-axial directions, and rotational directions about the axes. The x-axis, y-axis, and z-axis are perpendicular to one another. The z-axis has a positive direction that is the vertical upward direction, and is perpendicular to the plane made by the x-axis and the y-axis. In the apparatus 100 for processing and observing a cross section, the electron beam column 1 is disposed with the irradiation axis direction in parallel with the z-axial direction. In this example, the irradiation axis direction of the electron beam column 1 is the negative direction of the z-axis (i.e., vertical downward direction).

The apparatus 100 for processing and observing a cross section further includes an electron beam controller 12, a focused ion beam controller 13, an imager 14, and a display 17.

The electron beam controller 12 is controlled by a controller 11 to output a irradiation signal to the electron beam column 1, whereby the electron beam 8 is radiated from the electron beam column 1.

The focused ion beam controller 13 is controlled by the controller 11 to output a irradiation signal to the focused ion beam column 2, whereby the focused ion beam 9 is radiated from the electron beam column 2.

The imager 14 forms a transmission electron image based on the signal for radiating the electron beam 8 from the electron beam controller 12 and the signal of transmission electrons detected by the transmission electron detector 5. The imager 14 forms data of an SEM image based on the signal for radiating the electron beam 8 from the electron beam controller 12 and the signal of secondary electrons detected by the secondary electron detector 4. The imager 14 forms data of an SIM image based on the signal for radiating the focused ion beam 9 from the focused ion beam controller 13 and the signal of secondary electrons detected by the secondary electron detector 4.

The display 17 includes a display device such as a liquid crystal display and displays the transmission electron image, the SEM image, the SIM image, etc. described above.

The apparatus 100 for processing and observing a cross section further includes an input unit 10 and the controller 11. An operator of the apparatus 100 for processing and observing a cross section inputs conditions about apparatus control to the input unit 10. The input unit 10 outputs the input information to the controller 11.

The controller 11 (process controller) outputs a control signal to the electron beam controller 12, the focused ion beam controller 13, the imager 14, the sample bed controller 16, or the display 17, and controls operation of a charged particle beam device.

The apparatus 100 for processing and observing a cross section further includes an image quality corrector 18, a cross section image group output unit 19, and a memory unit 20.

The memory unit 20 includes a hard disk drive or a flash memory and stores various items of information. Target irradiation position information is stored in the memory unit 20. The target irradiation position information is information that shows target irradiation positions TGT of beams on the sample 7. An example of the target irradiation positions TGT is described with reference to FIG. 2.

Figure 2:
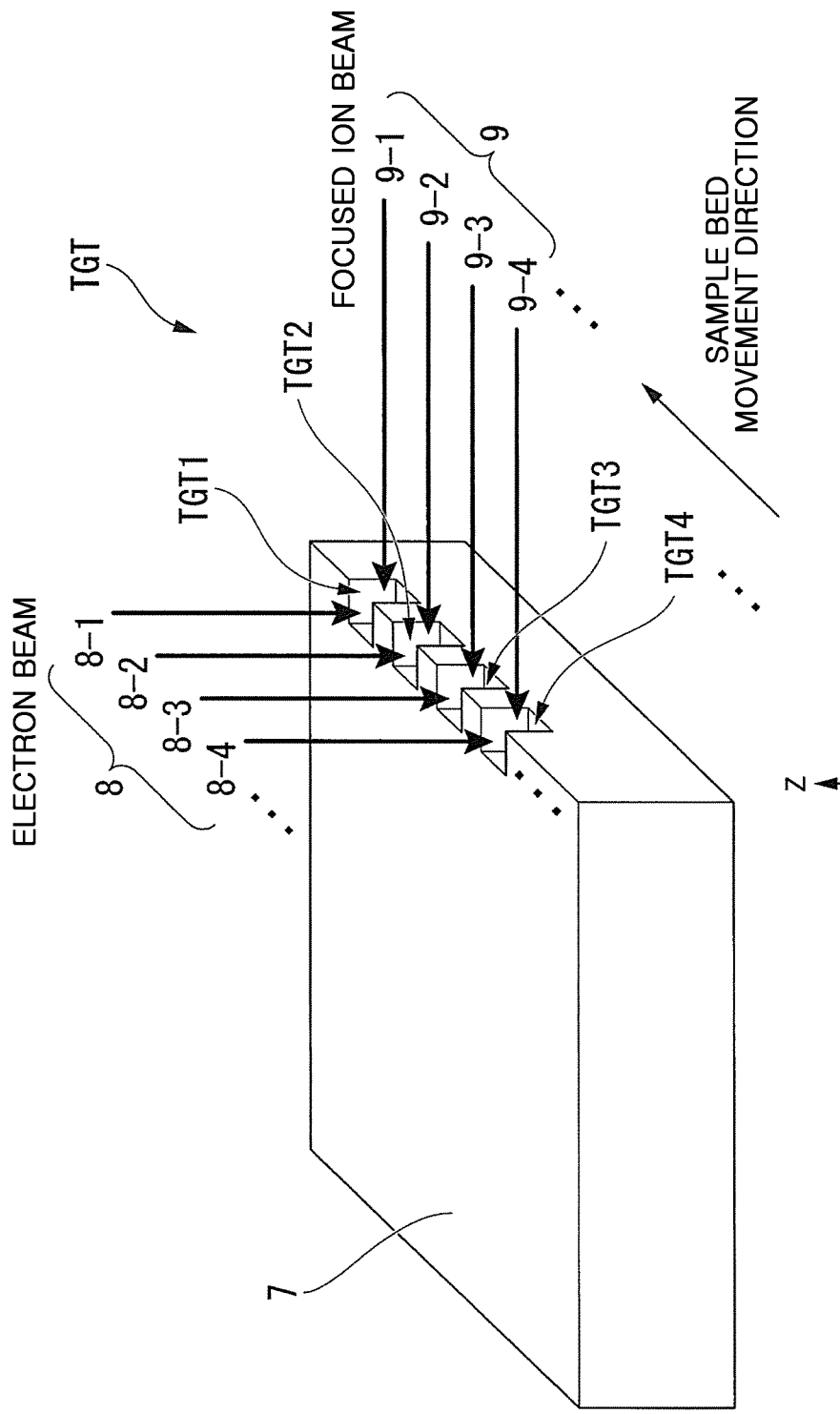
FIG. 2 is a view showing an example of target irradiation positions according to an embodiment of the present invention.

FIG. 2 is a view showing an example of target irradiation positions TGT according to an embodiment of the present invention. In this example, target irradiation positions TGT1~TGT4 have been determined in advance as positions where a process of exposing a cross section of the sample 7 is performed. The sample 7 has a structure of a measurement object. It is possible to obtain a cross section image by exposing a measurement object of a structure on a cross section using the apparatus 100 for processing and observing a cross section, so the sample 7 is pre-processed and put on the sample bed 6 in advance. In the pre-processing, an unnecessary part of the sample 7 is removed in advance such that the structure of a measurement object is positioned close to a surface, to which an electron beam and a focused ion beam are radiated, of the sample 7. Accordingly, it is possible to reduce a processing amount when processing a cross section using a focused ion beam, so Cut & See can be efficiently performed. The sample 7 is positioned such that the measurement direction of the structure is perpendicular to the direction of the irradiation of the electron beam. For example, when the structure is a cylinder and the measurement object is the diameter of the cylinder, the sample 7 is positioned such that the direction of the diameter of the cylinder is perpendicular to the direction of the irradiation of the electron beam. Accordingly, it is possible to form a cross section including the measurement object using the focused ion beam, so accurate measurement can be performed from the obtained cross section image.

The sample bed controller 16 (irradiation position controller) controls irradiation positions P of the focused ion beam 9 and the electron beam 8 based on the target irradiation position information stored in the memory unit 20 as information showing the target irradiation positions TGT of beams on the sample 7.

Referring to FIG. 1, the image quality corrector 18 corrects the image quality of cross section images that are obtained for irradiation positions P.

The cross section image group output unit 19 outputs a cross section image group including cross section images with the image quality corrected by the image quality corrector 18 to a measuring device (not shown) that measures the structure of the sample 7.

Next, an example of the operation of the apparatus 100 for processing and observing a cross section is described with reference to FIG. 3.

[Operation of the Apparatus 100 for Processing and Observing a Cross Section]

Figure 3:
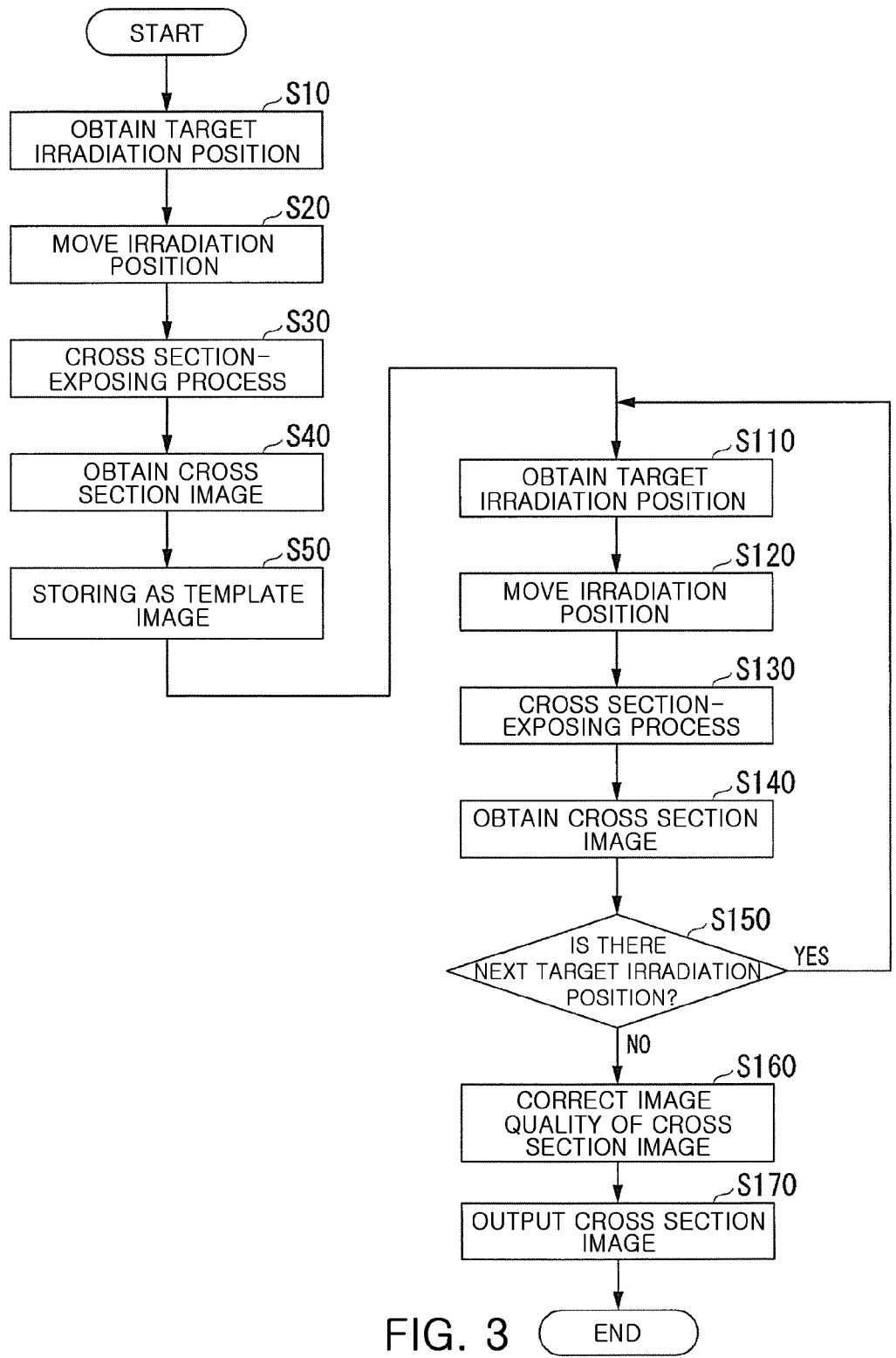
FIG. 3 is a view showing an example of the operation of an apparatus for processing and observing a cross section according to an embodiment of the present invention.

FIG. 3 is a view showing an example of the operation of an apparatus 100 for processing and observing a cross section according to an embodiment of the present invention.

An example of the apparatus 100 for processing and observing a cross section is described hereafter. The process from a step S10 to a step S50 is a template image-obtaining process and the process from a step S110 to a step S170 is a continuous cross section-processing/observing (sequential Cut & See) process.

[Template Image-Obtaining Process]

(Step S10): The controller 11 obtains target irradiation position information from the memory unit 20. The controller 11 obtains the coordinates of a target irradiation position TGT1 (see FIG. 2) that is the first target irradiation position TGT from the target irradiation position information.

Various parameters for obtaining images through the electron beam 8 and the detectors in processing that uses the focused ion beam 9 are stored in the memory unit 20 in relation to the target irradiation position information. For example, marking pattern information or processing parameters that are parameters for processing, and beam conditions, pattern information, image luminance, etc. that are parameters for obtaining images are stored in the memory unit 20 in relation to the target irradiation positions TGT.

(Step S20): The controller 11 outputs an instruction to the sample bed controller 16 to move the sample bed 6 such that the irradiation positions P of the electron beam 8 and the focused ion beam 9 coincide with the target irradiation position TGT1. When receiving the instruction to move the sample bed 6 from the controller 11, the sample bed controller 16 drives the sample bed 6 through the sample bed actuator 15.

(Step S30; cross section-exposing process): The controller 11 performs the processing for exposing a cross section of the sample 7 at the target irradiation position TGT1 shown in FIG. 2. In detail, when the irradiation positions P of the electron beam 8 and the focused ion beam 9 coincide with the target irradiation position TGT1 by movement of the sample bed 6 in step S20, the controller 11 outputs an instruction to the focused ion beam controller 13 to perform processing. Processing parameters for each of the target irradiation positions TGT stored in the memory unit 20 are included in the processing instruction. When receiving the processing instruction from the controller 11, the focused ion beam controller 13 controls the focused ion beam column 2 to irradiate the sample 7 with a focused ion beam 9-1 (see FIG. 2).

(Step S40; cross section image-obtaining process): The controller 11 obtains a cross section image for the target irradiation position TGT1. In detail, when the processing that exposing a cross section of the sample 7 at the target irradiation position TGT1 is finished, the controller 11 gives the electron beam controller 12 and the imager 14 instructions to radiate the electron beam 8 and form an image, respectively. Processing parameters for each of the target irradiation positions TGT stored in the memory unit 20 are included in the irradiation instruction and image formation instruction. The controller 11 stores the formed cross section image to the memory unit 20. As described above, since the electron beam column 1 and the focused ion beam column 2 are perpendicular to each other, the controller 11 can enable obtaining cross section images without moving (for example, inclining) the sample bed 6 after the cross section-exposing processing.

(Step S50): The controller 11 stores the cross section image of the sample 7 obtained in step S40 to the memory unit 20 as a template image. The template image is also called reference image quality information TMP in the following description.

[Cross Section-Processing and Observing (Cut & See) Process]

(Step S110~Step S140):

Next, the controller 11 performs cross section-exposing processing and obtains a cross section image for the next target irradiation position TGT (a target irradiation position TGT2 of FIG. 2). That is, the controller 11 controls a cross section-exposing process that exposes a cross section of the sample 7 by irradiating the sample 7 with the focused ion beam 9 and the cross section image-obtaining process that obtains a cross section image by irradiating the cross section with the electron beam 8, for each of the irradiation positions P that are controlled by the sample bed controller 16 (irradiation position controller). The detailed operation from step S110 to step S140 is the same as that from step S10 to step S40, it is not described in detail.

(Step S150): The controller 11 determines whether there is a next target irradiation position TGT with reference to the target irradiation position information stored in the memory unit 20. When determining that there is a next target irradiation position TGT (Step S150; YES), the controller 11 returns the process to step S110, thereby repeating the cross section-exposing process and the cross section image-obtaining process. In the example shown in FIG. 2, the cross section-exposing process and the cross section image-obtaining process are repeated for a target irradiation position TGT3 and a target irradiation position TGT4. When determining that there is no next target irradiation position TGT (step S150; NO), the controller 11 progresses the process to step S160.

(Step S160): The controller 11 outputs an instruction to the image quality corrector 18 to correct the image quality of the cross section images obtained for the irradiation positions P till step S150. The image quality corrector 18 corrects the image quality of the cross section images for each of the irradiation positions P stored in the memory unit 20. A detailed example where the image quality corrector 18 corrects image quality is described hereafter.

Further, the image quality corrector 18 corrects the brightness of images in the following description, but the present invention is not limited thereto. Other than the brightness of images, various pixel values such as contrast and luminance are included in the image quality that is corrected by the image quality corrector 18.

[Image Quality Correction (1): Based On Template Image]

The image quality corrector 18 corrects the image quality of the cross section images for the irradiation positions P based on a template image stored in the memory unit 20 in step S50. In the example shown in FIG. 2, a template image is a cross section image for the target irradiation position TGT1. The image quality corrector 18 corrects the image quality of the cross section images for each of the irradiation positions P based on the image quality of the template image.

The template image is an example of the reference image quality information TMP described above. That is, the image quality corrector 18 corrects the image quality of cross section images based on the reference image quality information TMP stored in advance in relation to the target irradiation positions TGT as information showing reference image quality of cross section images.

[Image Quality Correction (2): Based on Threshold Value]

When image quality exceeds a permission range of image quality shown by the reference image quality information TMP, the image quality corrector 18 corrects the quality of the cross section image. In detail, information showing the permission range of image quality (e.g., threshold values of the brightness of images) is stored in advance as the reference image quality information TMP in the memory unit 20. When the brightness of a cross section image obtained for a irradiation position P in Step S140 is lower than a lower limit threshold value, the image quality corrector 18 corrects the brightness of the cross section image. When the brightness of a cross section image exceeds an upper limit threshold value, the image quality corrector 18 corrects the cross section image to be dark.

[Image Quality Correction (3): Based on Estimation Value of Intensity of Electron Beam 8]

The intensity of the electron beam 8 affects the brightness of cross section images. For example, when the intensity of the electron beam 8 is relatively weak, cross section images become relatively dark. In the sequential Cut & See process, when there are a large number of target irradiation positions TGT, the cross section-exposing process and the cross section-obtaining process take relatively long time. In this case, the intensity of the electron beam 8 may change (e.g., decreases) as time passes. When the relationship between the intensity of the electron beam 8 and lapsed time is known, information showing the change to time of the intensity of the electron beam 8 is stored in advance in the memory unit 20.

The image quality corrector 18 estimates the intensity of the electron beam 8 based on time lapsed from start of the sequential Cut & See process and the information showing the change to time of the intensity of the electron beam 8 stored in the memory unit 20. The image quality corrector 18 corrects the brightness of cross section images based on the estimated change to time of the intensity of the electron beam 8. That is, the image quality corrector 18 corrects the image quality of cross section images based on intensity information showing the change to time of the intensity of the electron beam 8 radiated from the electron beam column 1.

For example, when the intensity of the electron beam 8 decreases as time passes, the image quality corrector 18 corrects cross section images obtained relatively later to be brighter.

Image quality correction is not necessarily performed on each irradiation position P. That is, image quality correction may be performed on some of several cross section images obtained for one irradiation position P.

The operation of the apparatus 100 for processing and observing a cross section is kept described with reference to FIG. 3.

(Step S170): The cross section image group output unit 19 supplies a cross section image group corrected in step S160 to the measuring device (not shown). An example of the cross section image group that is supplied from the cross section image group output unit 19 to the measuring device is described with reference to FIG. 4.

Figure 4:
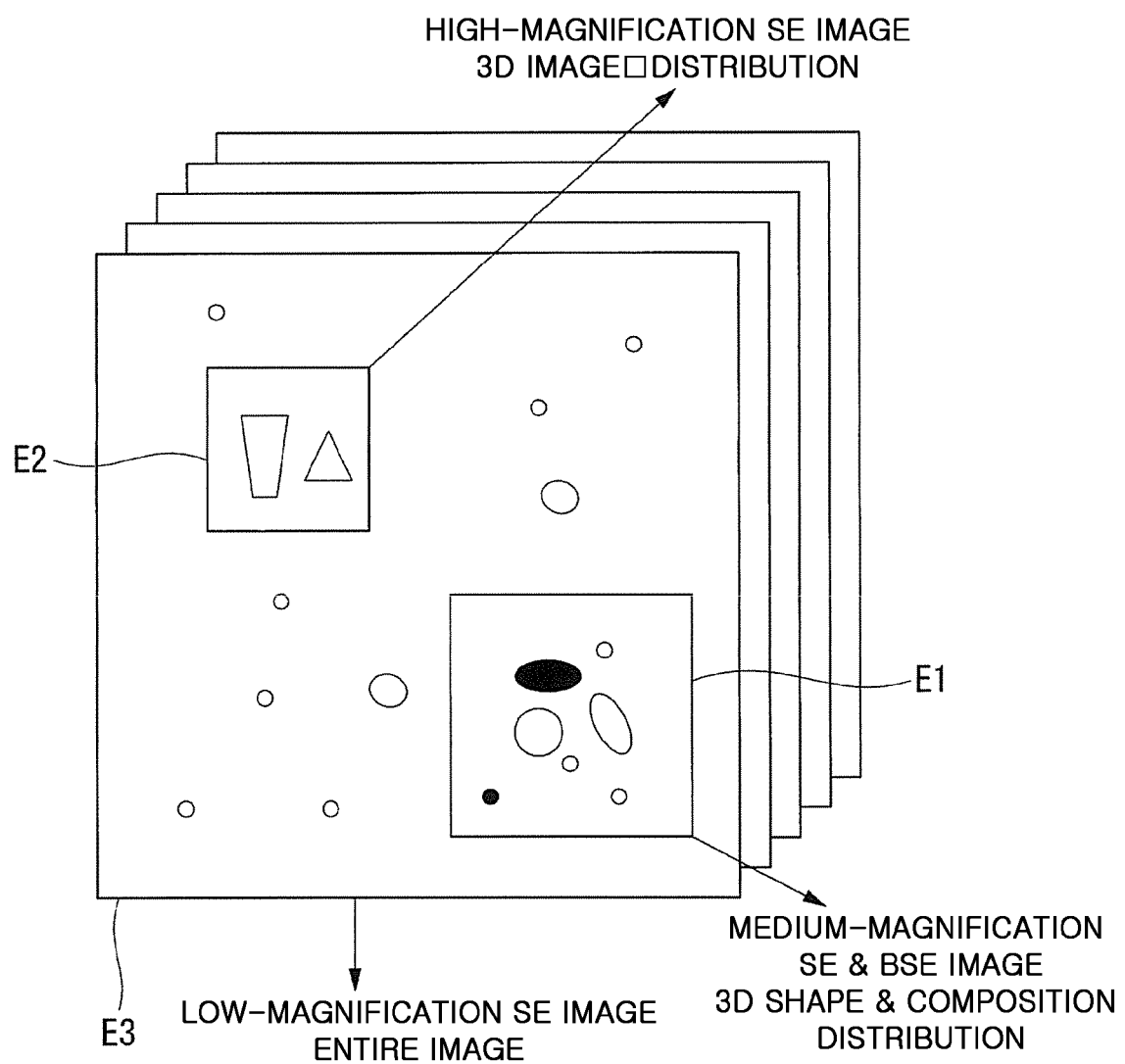
FIG. 4 is a view showing an example of a cross section image group that is provided by a cross section image group output unit according to an embodiment of the present invention.

FIG. 4 is a view showing an example of a cross section image group that is provided by a cross section image group output unit 19 according to an embodiment of the present invention. Two local areas E1 and E2 and an entire cross section observation image E3 are included in the example of cross section images shown in FIG. 4. Specific observation objects are included in the local areas E1 and E2. For the local areas E1 and E2, observation images are obtained under conditions that are different from the conditions for obtaining the entire cross section observation image E3. For example, when a low magnification is applied to the entire cross section observation image, an SEM image is obtained by applying a medium magnification to the local area E1. Further, composition distribution in the local area E1 is obtained by obtaining a BSE image. For example, when a low magnification is applied to the entire cross section observation image, an SEM image is obtained by applying a high magnification to the local area E2.

Figure 5:
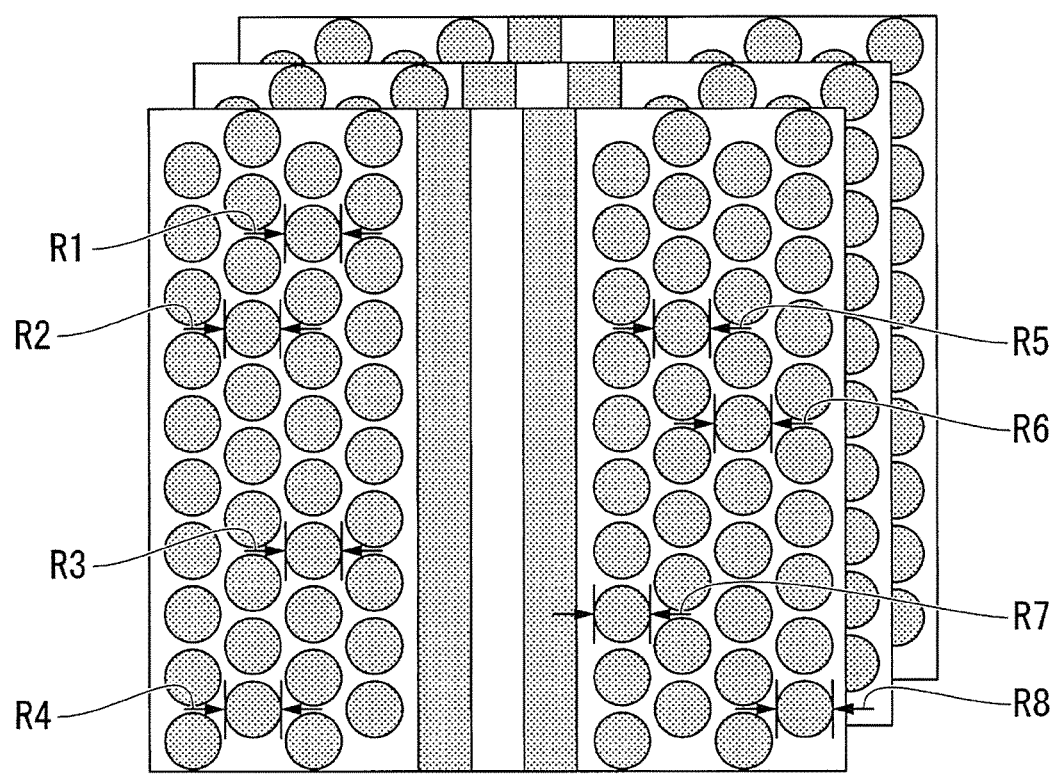
FIG. 5 is a view showing an example of measuring a shape by a measuring device.

FIG. 5 is a view showing an example of measuring a shape by a measuring device. Cross section images are supplied to the measuring device (not shown) from the cross section image group output unit 19. The measuring unit measures the diameter R (R1~R8 in the figure) of the shape (e.g., a cylinder) of the sample 7 shown in the cross section images.

Figure 6:
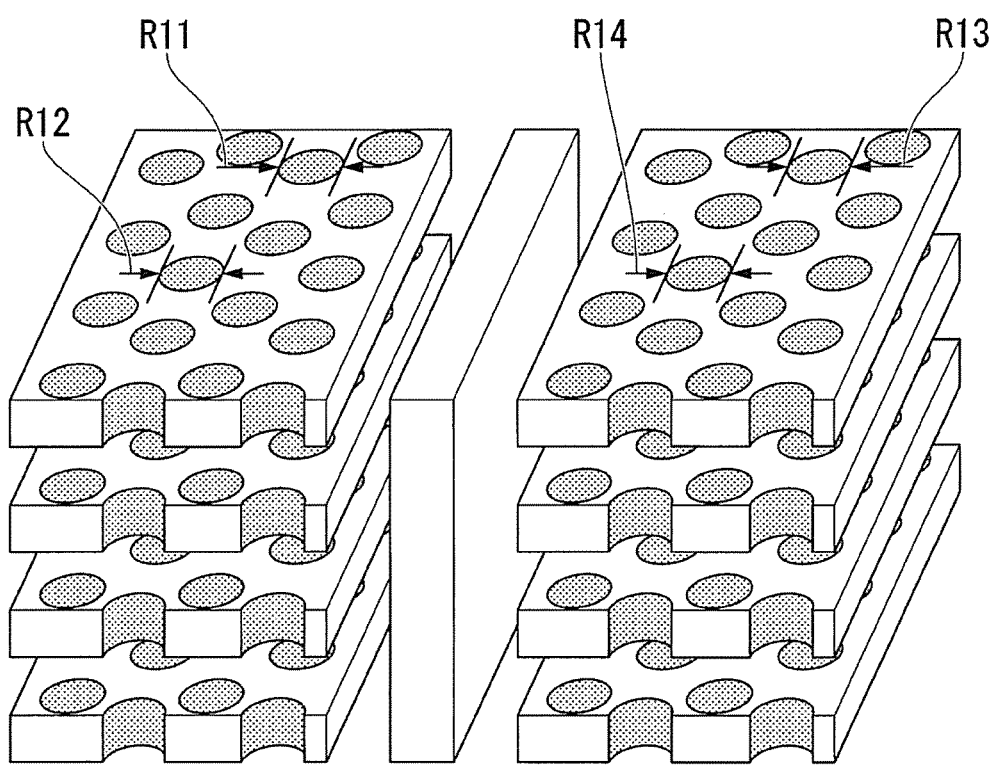
FIG. 6 is a view showing an example of a 3D image.

FIG. 6 shows an example of a 3D image. The measuring device constructs a 3D image showing the inside of the sample 7 by layering several cross section images obtained from the cross section image group output unit 19.

The measuring unit measures the diameter R (R11~R14 in the figure) of the shape (e.g., a cylinder) of the sample 7 shown in the constructed 3D image. Accordingly, it is possible to accurately measure the shape of a cylinder even if the diameter of the cylinder changes in the depth direction.

Summary of Embodiment

As described above, according to the apparatus 100 for processing and observing a cross section, an electron beam column 1 and a focused ion beam column 2 are arranged perpendicular to each other and an electron beam 8 is radiated perpendicular to a focused ion beam 9. Therefore, according to the apparatus 100 for processing and observing a cross section of the embodiment, it is possible to obtain SEM images of accurate real cross sections without moving (e.g., inclining) a sample bed 6 after performing the cross section-exposing processing.

Further, the apparatus 100 for processing and observing a cross section includes an image quality corrector 18 that corrects the image quality of a cross section image that is obtained for each irradiation position P. Therefore, according to the apparatus 100 for processing and observing a cross section of the embodiment, in the sequential Cut & See process (e.g., step S110~Step S140) described above, it is possible to make the image quality of cross section images, which are obtained without the image quality regulated by an operator, uniform.

Therefore, according to the apparatus 100 for processing and observing a cross section of the embodiment, it is possible to obtain SEM images of accurate real cross sections. Further, since the image qualities of several SEM images are made uniform, it is possible to more precisely measure a shape (e.g., a 3D shape) based on the SEM images.

The apparatus 100 for processing and observing a cross section of the embodiment corrects the image quality of cross section images based on reference image quality information TMP. In the template image-obtaining process in step S10~step S40, an operator of the apparatus 100 for processing and observing a cross section can obtain image quality suitable for measurement by manually regulating the image quality of cross section images. According to the apparatus 100 for processing and observing a cross section of the embodiment, by correcting cross section images based on a template image with image quality suitable for measurement, it is possible to make cross section images, which are obtained without the image quality regulated by an operator in the sequential Cut & See process of step S110~step S140, uniform with image quality suitable for measurement.

According to the apparatus 100 for processing and observing a cross section of the embodiment, the image quality corrector 18 corrects the image quality of a cross section image when the image quality exceeds a permission range of image quality shown by reference image quality information TMP. Therefore, according to the apparatus 100 for processing and observing a cross section of the embodiment, it is possible to suppress non-uniformity of the image quality of several cross section images within a predetermined range (between upper and lower threshold values).

According to the apparatus 100 for processing and observing a cross section of the embodiment, the image quality corrector 18 corrects the image quality of a cross section image based on intensity information showing a change to time of the intensity of the electron beam 8. Therefore, according to the apparatus 100 for processing and observing a cross section of the embodiment, it is possible to make the image quality of several cross section images uniform with higher precision.

Although embodiments of the present invention were described above in detail with reference to the drawings, the detailed configuration is not limited to the embodiments and may be appropriately changed without departing from the scope of the present invention. Further, the embodiments described above may be appropriately combined without departing from the scope of the present invention.

Further, the apparatus includes a computer. The processes that are performed by the apparatus are stored in program formats in a computer-readable storage medium and the computer reads out the programs, whereby the programs are performed. The computer-readable storage medium is a magnetic disc, a magneto-optical disc, a CD-ROM, a DVD-ROM, a semiconductor memory, etc. The computer programs may be transmitted to a computer through a network such that the computer receiving the programs performs the programs.

The programs may be programs for achieving some of the functions described above. The programs may be programs that can achieve the functions by combination with other programs recorded in advance in a computer system, that is, difference files (difference programs).

The invention claimed is:

1. An apparatus for processing and observing a cross section, the apparatus comprising:
   a sample bed holding a sample;
   a focused ion beam column irradiating the sample with a focused ion beam;
   an electron beam column irradiating the sample with an electron beam in a direction perpendicular to a direction of irradiation of the focused ion beam;
   an electron detector detecting secondary electrons or reflection electrons generated from the sample;
   an irradiation position controller controlling irradiation positions of the focused ion beam and the electron beam based on target irradiation position information which is information showing target irradiation positions of beams on the sample, stored in a memory unit;
   a process controller controlling, for each irradiation position that is controlled by the irradiation position controller, a cross section-exposing process that exposes a cross section of the sample by irradiating the sample with the focused ion beam and a cross section image-obtaining process that obtains a cross section image of the cross section by irradiating the cross section with the electron beam, for the irradiation positions that are controlled by the irradiation position controller and storing the cross section image obtained in relation to a first target irradiation position in the memory unit as a reference image quality information which is information showing reference image quality of the cross-section image; and
   an image quality corrector correcting image quality of the cross section image obtained for the irradiation positions,
   wherein the image quality corrector corrects the image quality of the cross section image for a second target irradiation position which is an irradiation position next to the first target irradiation position, based on the reference image quality information and
   wherein the image quality of the cross section is at least one of brightness, contrast, or luminance of the cross section.

2. The apparatus of claim 1, wherein the image quality corrector corrects the image quality of the cross section image when the image quality of the cross section image exceeds a permission range of image quality indicated by the reference image quality information.

3. The apparatus of claim 1, wherein the image quality corrector corrects the image quality of the cross section image based on intensity information indicating a change of intensity of the electron beam irradiated from the electron beam column over time.

4. The apparatus of claim 2, wherein the image quality corrector corrects the image quality of the cross section image based on intensity information showing a change of intensity of the electron beam irradiated from the electron beam column over time.

5. The apparatus of claim 1, further comprising a cross section image group output unit outputting a cross section image group including the cross section image with the image quality corrected by the image quality corrector to a measuring device that measures a structure of the sample.

6. The apparatus of claim 2, further comprising a cross section image group output unit outputting a cross section image group including the cross section image with the image quality corrected by the image quality corrector to a measuring device that measures a structure of the sample.

7. The apparatus of claim 3, further comprising a cross section image group output unit outputting a cross section image group including the cross section image with the image quality corrected by the image quality corrector to a measuring device that measures a structure of the sample.

8. The apparatus of claim 3, further comprising a cross section image group output unit outputting a cross section image group including the cross section image with the image quality corrected by the image quality corrector to a measuring device that measures a structure of the sample.

9. The apparatus of claim 4, further comprising a cross section image group output unit outputting a cross section image group including the cross section image with the image quality corrected by the image quality corrector to a measuring device that measures a structure of the sample.

10. A method of processing and observing a cross section that uses an apparatus for processing and observing the cross section, the apparatus including a sample bed holding a sample, a focused ion beam column irradiating the sample with a focused ion beam, an electron beam column irradiating the sample with an electron beam in a direction perpendicular to a direction of irradiation of direction of the focused ion beam, and an electron detector detecting secondary electrons or reflection electrons generated from the sample,
    the method comprising a template image-obtaining process, a cross section-processing and observing process and an image quality-correcting process,
    wherein the template image-obtaining process comprises:
    an irradiation position control process that controls irradiation positions of the focused ion beam and the electron beam based on first target irradiation position information which is information showing a first target irradiation position of beams on the sample, stored in a memory unit;
    a cross section-exposing process that exposes a cross section of the sample by irradiating the sample with the focused ion beam for the first target irradiation position that are controlled in the irradiation position control process; and
    a cross section image-obtaining process that obtains a cross section image of the cross section by irradiating the cross section with the electron beam for the first target irradiation position that is controlled in the irradiation position control process and stores the cross section image for the first target irradiation position in the memory unit as a reference image quality information which is information showing reference image quality of the cross-section image;
    wherein the cross section-processing and observing process exposes the cross section of the sample by irradiating a second target irradiation position which is an irradiation position next to the first target irradiation position of the sample with the focused ion beam and obtains the cross section image of the cross section by irradiating the cross section with the electron beam for the second target irradiation position, wherein the image quality-correcting process corrects an image quality of the cross section image in relation to the second target irradiation position based on the reference image quality information; and wherein the image quality of the cross section is at least one of brightness, contrast, or luminance of the cross section.

11. A computer-readable and non-transitory medium storing a program for processing and observing a cross section, the program performing, in a computer of an apparatus for processing and observing the cross section, the apparatus including a sample bed holding a sample, a focused ion beam column irradiating the sample with a focused ion beam, an electron beam column irradiating the sample with an electron beam in a direction perpendicular to a direction of irradiation of the focused ion beam, and an electron detector detecting secondary electrons or reflection electrons generated from the sample, a template image-obtaining process, a cross section-processing and observing process and an image quality-correcting process, wherein the template image-obtaining process comprises;

an irradiation position control process that controls irradiation positions of the focused ion beam and the electron beam based on first target irradiation position information which is information showing a first target irradiation position of beams on the sample, stored in a memory unit;

a cross section-exposing process that exposes a cross section of the sample by irradiating the sample with the focused ion beam for the first target irradiation position that are controlled in the irradiation position control process; and a cross section image-obtaining process that obtains a cross section image of the cross section by irradiating the cross section with the electron beam for the first target irradiation position that is controlled in the irradiation position control process and stores the cross section image for the first target irradiation position in the memory unit as a reference image quality information which is information showing reference image quality of the cross-section image;

wherein the cross section-processing and observing process exposes the cross section of the sample by irradiating a second target irradiation position which is an irradiation position next to the first target irradiation position of the sample with the focused ion beam and obtains the cross section image of the cross section by irradiating the cross section with the electron beam for the second target irradiation position, wherein the image quality-correcting process corrects an image quality of the cross section image in relation to the second target irradiation position, based on the reference image quality information; and wherein the image quality of the cross section is at least one of brightness, contrast, or luminance of the cross section.

* * * * *